United States Patent [19]
Corsi et al.

[11] Patent Number: 5,519,341
[45] Date of Patent: May 21, 1996

[54] CROSS COUPLED QUAD COMPARATOR FOR CURRENT SENSING INDEPENDENT OF TEMPERATURE

[75] Inventors: Marco Corsi, Dallas, Tex.; Gabriel A. Rincon, Margate, Fla.

[73] Assignee: Texas Instruments Incorporated, Dallas, Tex.

[21] Appl. No.: 349,168

[22] Filed: Dec. 2, 1994

[51] Int. Cl.[6] ............................................. H03K 5/153
[52] U.S. Cl. ........................................ 327/80; 327/427
[58] Field of Search ............................ 327/51–57, 77, 327/80, 81, 142, 215–219, 427

[56] References Cited

U.S. PATENT DOCUMENTS

| | | | |
|---|---|---|---|
| 3,849,673 | 11/1974 | Koo | 327/427 |
| 4,119,870 | 10/1978 | Zibert | 327/427 |
| 4,124,808 | 1/1977 | Shiev et al. | 327/427 |
| 5,192,906 | 3/1993 | Nathan | 323/284 |
| 5,245,526 | 9/1993 | Balakrishnan et al. | 327/77 |
| 5,247,240 | 9/1993 | Kayser et al. | 323/288 |
| 5,404,053 | 4/1995 | Poma et al. | 327/108 |

OTHER PUBLICATIONS

Analogue IC Design: The Current–Mode Approach edited by C. Toumazou, F. J. Lidgey & D. G. Haigh (paper by Barry Gilbert, see p. 70 ff.).

*Primary Examiner*—Timothy P. Callahan
*Assistant Examiner*—Jeffrey Zweizig
*Attorney, Agent, or Firm*—Mark E. Courtney; W. James Brady, III; Richard L. Donaldson

[57] ABSTRACT

A circuit and method for sensing and limiting current. A resistor (R1) is used to generate a voltage (V1) proportional to the current flowing in an output transistor (M1). A comparator is formed in a cross coupled quad configuration from bipolar transistors (Q11, Q12, Q13 and Q14) and is coupled to the resistor (R1). When the current in the resistor (R1) generates a voltage in excess of a threshold voltage for the cross coupled quad circuit, the cross coupled quad generates an output indicating the threshold has been reached. In a current limiting configuration, the output of the cross coupled quad is used to reset a flip-flop (FF1) that drives the gate terminal of the output transistor (M1), thus shutting down the output transistor before it is damaged due to excess current. The threshold voltage that triggers the cross coupled quad is proportional-to-absolute-temperature. This property allows the comparator to be combined with an aluminum resistor (R1) to form a current sensing circuit that has a threshold current that is independent of temperature, since the temperature coefficient of the resistor will cancel the temperature coefficient of the comparator. The threshold voltage of the comparator may be adjusted by adjusting the emitter areas of the bipolar transistors (Q11, Q12, Q13 and Q14) which make up the cross coupled quad circuit. The circuitry of the invention may be applied to a high side driver or a low side driver output circuit. Other embodiments are also described.

20 Claims, 2 Drawing Sheets

CROSS COUPLED QUAD COMPARATOR FOR CURRENT SENSING INDEPENDENT OF TEMPERATURE

FIELD OF THE INVENTION

This invention relates generally to the field of integrated circuits and the limiting of currents on integrated circuits, and specifically to the use of comparators on an integrated circuit to sense the value of currents output by an output transistor on the integrated circuit.

BACKGROUND OF THE INVENTION

In producing integrated circuits to drive high current outputs, it is often desirable to monitor the current being driven through a particular device and to limit this current so that no damage occurs to the driving device.

Various prior art approaches to this problem exist. FIGS. 1, 2 and 3 are schematics of three prior art current limiting circuits. In FIG. 1, transistor M1 is an NMOS power transistor which is connected between the low-potential side of a load and ground. This configuration is usually called a low-side-drive (hereinafter LSD) configuration. The NMOS transistor M1, when enabled by the output of set-reset flip-flop FF1, will pull an output terminal OUT to a low voltage. A small resistor R1 is inserted between M1's source and ground. When the set-reset flip flop FF1 is set by a voltage pulse at the input terminal Vin, the Q output enables transistor M1 to conduct. Some current flows through the transistor and into resistor R1. The voltage developed across this resistor is proportional to the current flowing through the M1 transistor's source. When this voltage exceeds a threshold voltage V1, comparator C1 trips and resets flip-flop FF1, turning off the power transistor to protect it against excessive current flow. There are many variations on this circuit, including ones where the flip-flop FF1 is replaced by various timing circuits, and circuits where the resistor is placed in the drain of the power transistor rather than in the source. There are also prior art circuits where the inherent resistance of the power device is used as a sense resistor, eliminating the need for a separate sense resistor R1.

FIG. 2 depicts the use of the approach of FIG. 1 in a high-side-drive (hereinafter HSD) situation. Now the output transistor M1 attempts to pull an output node high when enabled. Terminal OUT is coupled to the load and will be pulled up dose to the voltage Vcc when the gate of PMOS transistor M1 is enabled by FF1. As before, the current is sensed by the small resistor R1 which creates a voltage proportional to the current flowing through the output transistor M1. The comparator C1 trips when the current flowing through R1 causes the voltage across R1 to exceed the reference voltage V1, and the flip flop is reset causing the output transistor M1 to cut off, thereby protecting the output transistor.

The main difficulty in realizing the current limit schemes of FIGS. 1 and 2 is the common-mode range required of the comparator. In the low-side-drive configuration of FIG. 1, the comparator's common-mode range must include ground. In the high-side-drive configuration of FIG. 2, the comparator's common-mode range must include the supply. For this reason, many existing implementations of current-limit circuits use emitter-side comparators as alternatives to the conventional comparators depicted in the prior art circuits of FIGS. 1 and 2.

A prior art current limit circuit based on a simple emitter-side comparator is shown in FIG. 3. As before, the current through power transistor M1 is sensed by the insertion of a resistor R1 between source and ground. Current flowing through R1 develops a voltage potential V1. A pair of NPN transistors Q1 and Q2, having equal emitter areas, form the comparator. Transistor Q2 is diode-connected, and a current source I2, providing a relatively small but constant current, is connected so as to feed the collector-base side of Q2. The emitter of Q2 is connected through resistor R2 to ground.

In operation the circuit of FIG. 2 compares the current flowing through resistor R1, which is proportional to the current flowing in the output transistor M1, to the current flowing in resistor R2. If base current errors are neglected, the potential developed across R2 is just $V2=I2*R2$. If voltage $V1=V2$, then the emitter current which Q1 can support will be equal to that which Q2 can support. Thus, if a current source I1 is connected to the collector of Q1, such that $I1=I2$, Q1 will just be able to sink this current when $V1=V2$. If $V1<V2$, Q1 will attempt to sink more current than I1 can provide, and V3 will go low (Q1 will saturate). If $V1>V2$, Q1 will not be able to sink all of the current provided by I1, and V3 will go high (Current source I1 will saturate). Therefore, Q1 and Q2 form a comparator with a trip point when $V1=V2$. Because the voltages to be compared are present at the emitters of the NPN transistors, this configuration is sometimes called an emitter-side comparator or emitter-sensing comparator. The current limit that this comparator provides is simply:

$$I_{LIMIT}=R2/(R1*I2) \tag{1}$$

A minor problem with the operation of the circuit of FIG. 3 as described above is that transistor Q1 is normally saturated, and must come out of saturation when the current limit is exceeded. Stored charge in Q1 will cause substantial delay in the comparator's action. This can be cured by using a Schottky clamp on Q1, as is shown in FIG. 3 by the cuffed ends on the transistor Q1's base.

Several assumptions are made in the analysis which led to equation (1). First, I1 (and therefore I2 as well) are assumed to be much smaller than the current drawn by the load. If this is not true, then the value of R1 must be adjusted to compensate for the IR drop caused by I1. The assumption that I1<<IL is usually a fairly good assumption, as load currents are usually 100 mA or more, and the transistors Q1 and Q2 can be run at a small fraction of a milliamp. Another assumption is that the base current error caused by Q1 does not unbalance the currents IR1 and IR2. If transistor betas are low, a base current cancellation technique can be used to eliminate the base current errors.

Another assumption which is implicit in the circuit of FIG. 3 is that resistors R1 and R2 are well-matched. R1 is usually much smaller than R2. For example, suppose a 1 Amp current limit is desired, and the emitter-side comparator is fed 10 microamps per side. The two resistors now differ in value by five orders of magnitude! Such an enormous mismatch implies difficulty in constructing well-matched resistors. In order to conserve space, the two resistors are often fabricated using very different materials so as to provide different resistivities. If this is done, matching becomes very difficult to maintain over the expected ranges of temperature and process variations. Also, the current source supplying the current I2 is critical to the operation of the circuit, because the threshold at which the current limiting begins is directly proportional to I2. The circuit will therefore exhibit a considerable dependence on temperature and process variations, and the current sources will have to be fairly complex circuits to provide stable currents I1 and I2 in spite of these variations.

The current limiting schemes of the prior art have limitations that do not make them well suited for integrated circuit applications. Thus there is a need for an improved current limiting scheme for use in power integrated circuits and systems.

SUMMARY OF THE INVENTION

A current sensing circuit and method for an output driver is described. An aluminum current sensing resistor is placed between the output driver and a voltage supply. The resister generates a voltage that is proportional to the current flowing in the output driver transistor. A cross coupled quad circuit constructed of bipolar transistors is coupled to the resistor. The cross coupled quad circuit has an output that indicates when the voltage across the resistor exceeds a threshold. Because the threshold voltage of the cross coupled quad is a proportional-to-absolute-temperature quantity, the circuit effectively cancels out the observed temperature coefficient of an aluminum resistor. The result is a current limiting circuit that will output a high voltage when the current flowing in the resister exceeds a threshold. The circuit will detect the threshold current substantially independent of temperature. The output of the comparator is then used to reset a flip-flop that is coupled to the gate of the output transistor, therefore the output transistor is shut down before damage can occur. The threshold current is proportional to the natural logarithm of a ratio proportional to the area of the emitters of the transistors used in the cross coupled quad comparator, and therefore any desired threshold current can be easily achieved.

The comparator of the current limiting circuit can be used with both low side driver and high side driver configurations for output driver circuits. The comparator can be used as a zero current detector. A measure of the resistance values on an integrated circuit can be obtained by sending a current into the output driver circuit that is known to equal the expected threshold current of the comparator. By observing the trip point of the current limiting circuit, any variance in the expected resistance value can be measured.

BRIEF DESCRIPTION OF THE DRAWINGS

Corresponding numerals are used for corresponding elements in the drawings, unless otherwise indicated in the text.

DETAILED DESCRIPTION OF PREFERRED EMBODIMENTS

Figure 4:
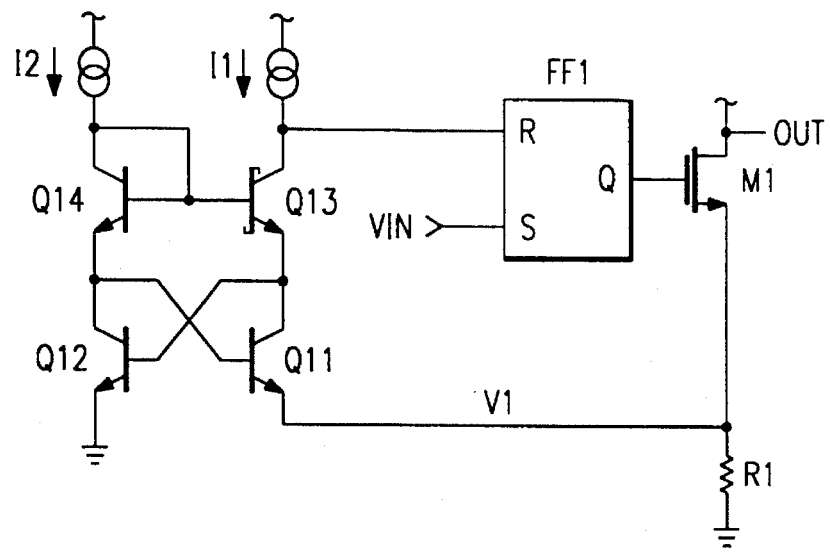
FIG. 4 depicts a schematic of a low side driver embodiment of a current limiting circuit incorporating the invention.

FIG. 4 is a circuit schematic of a preferred embodiment of a current limiting scheme incorporating the invention. FIG. 4 is a low side driver configuration for an output driver. As before, set-reset flip-flop FF1 controls the gate terminal of the driving transistor M1, an NMOS power transistor. Other output devices can be used, as the current limiting scheme is not tied to the type of output driver, and the NMOS power transistor is merely presented as the most likely example. The output terminal OUT is coupled to a low voltage when the Q output of FF1 is high. An input terminal VIN is coupled to the S input and sets the flip-flop. A small resistor R1 is coupled between the source of the output transistor M1 and ground, as before, and will have a current flowing through it that is proportional to the current flowing in the output transistor M1. A cross coupled quad comparator comprised of transistors Q11, Q12, Q13 and Q14 is coupled to the resistor R1. The cross coupled quad is essentially a balanced circuit.

In normal operation, the current flowing through transistors Q14 and Q12 is set by the current source I2. The current flowing through transistors Q13 and Q11 is set by the voltage at V1. The transistors Q14 and Q12 have their operating points set by current I2, and they are used to bias the base terminals of transistors Q13 and Q11. Since the load current flowing through M1 will be substantially higher than the current flowing out of the emitter of Q11, the voltage at V1 is essentially determined only by R1 and the load current I1. The resistor can be seen as a current sensor outputting a voltage V1 which is proportional to the load current. Nominally, the current which can flow through transistors Q13 and Q11 in FIG. 4 is determined by the base emitter voltages on these transistors, which is in turn determined by the voltage V1. When V1 is low, the base emitter voltages will be large and the transistors will absorb all the current delivered by current source I1. The collector of Q13 will then saturate, and a portion of the current provided by I2 will be redirected into the base of transistor Q13 to balance the circuit. As a result, the collector of Q13 will be at a low voltage. As the current in R1 rises, the voltage V1 also rises, causing the base emitter voltage of Q11 to fall, reducing the current flow through Q11 and also through Q13. The current source I1 now pulls up the collector of Q13 and causes a high voltage on the reset terminal R of the flip flop FF1, shutting down the output transistor M1. This trigger point will occur when the current flowing into the collector of Q13 equals the current from current source I1.

The threshold or trip point of the cross coupled quad circuit, which sets the current limit at which the flip-flop will be reset, occurs when the cross coupled quad is in a state of balance with its current sources I1 and I2. When the circuit is in this state of balance, the current drawn by transistor Q13 exactly equals the current provided by current source I1. An analysis will now be made of the cross coupled quad comparator of Q11–Q14 in this state of balance. This analysis will show how the current limit can be computed.

The core of this circuit is the cross-coupled quad formed from four NPN transistors, Q11–Q14. A simple analysis of the cross- coupled quad circuit can be made by examining the base-emitter voltage drops and writing an expression for the threshold voltage at the node V1 in the figure in terms of the base emitter voltages Vbe for each transistor, as:

$$V1 = Vbe12 + Vbe13 - Vbe11 - Vbe14 \tag{2}$$

By substituting in the well-known base-emitter voltage-current approximation $Vbe = V_T \ln(Ie/(Ae * Is))$ for each of the four transistors, wherein $V_T$ is the thermal voltage, Ie is the emitter current, Is is the saturation current and Ae is the emitter area, the expression becomes:

$$V1 = V_T \ln(Ie12/(Ae12*Is)) + V_T \ln(Ie13/(Ae13*Is)) - V_T \ln(Ie11/$$

$$(Ae11*Is)) - V_T \ln (Ie14/(Ae14*Is)) \qquad (3)$$

In equation [3], the saturation current Is for all four transistors is assumed to be equal because the four transistors are matched devices using identical base-emitter diffusion profiles. Equation [3] can be simplified to:

$$V1 = V_T \ln ((Ae12*Ae13)/(Ae11*Ae14)) \qquad (4)$$

The simplification of equation (3) to equation (4) is accomplished by assuming the emitter currents Ie14=Ie12 and Ie11=Ie13, which again assumes that base current errors are negligible, and then applied straightforward mathematical manipulation. A first important feature of this result is that bias currents I1 and I2 are not in the equation; indeed voltage V1 does not (to a first order) depend upon the currents which are used to operate the cross-coupled quad. The second interesting feature of equation (4) is that voltage $V_T$ is directly proportional to temperature, as $V_T$ (the thermal voltage) is given by the equation:

$$V_T = kT/q \qquad (5)$$

where k is Boltzmann's constant, T is absolute temperature, and q is the elementary electron charge constant. Neither k nor q is temperature-dependent, and the resulting conclusion is that voltage V1 is directly proportional-to-absolute-temperature (hereinafter PTAT), and depends only upon the ratio of emitter areas of Q11–Q14.

The circuit of FIG. 4 makes use of the PTAT properties of voltage V1. Resistor R1 is ideally a very small value resistor, so as to limit the losses caused by inserting it into the power conduction path through output transistor M1. Resistors can be made of aluminum, which is a standard interconnection material used in integrated circuit fabrication. The temperature coefficient of aluminum near room temperature (300 K.) is about 3400 ppm/°C. This value is very close to the temperature coefficient of a PTAT quantity, which is simply 1/T, or 3330 ppm/°C. Therefore, the temperature coefficient of the aluminum resistor can be nearly canceled by the temperature coefficient inherent in the thermal voltage. The shut down threshold current Ithreshold of the current limiting circuit of FIG. 4 is reached when the voltage drop across R1 equals the value given by equation (4):

$$Ithreshold = (V_T/R1) \ln ((Ae12*Ae13)/(Ae11*Ae14)) \qquad (6)$$

Figure 1:
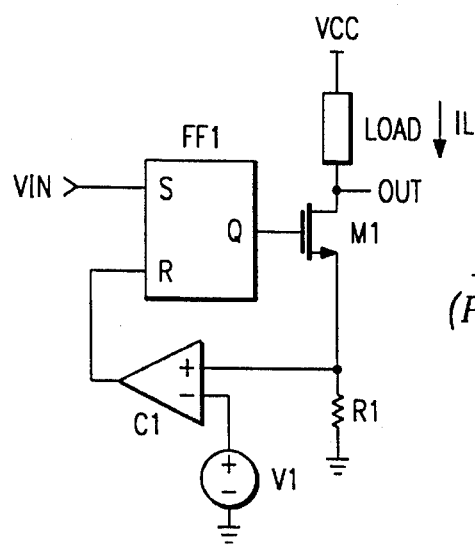
FIG. 1 (prior art) depicts a schematic of a prior art current limiting circuit for a low side driver.
Figure 2:
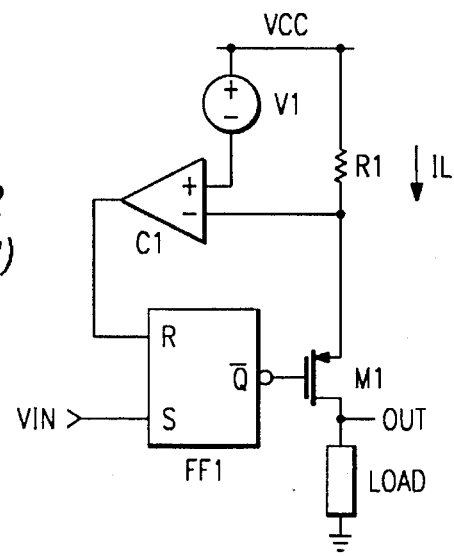
FIG. 2 (prior art) depicts a schematic of a prior art current limiting circuit for a high side driver.
Figure 3:
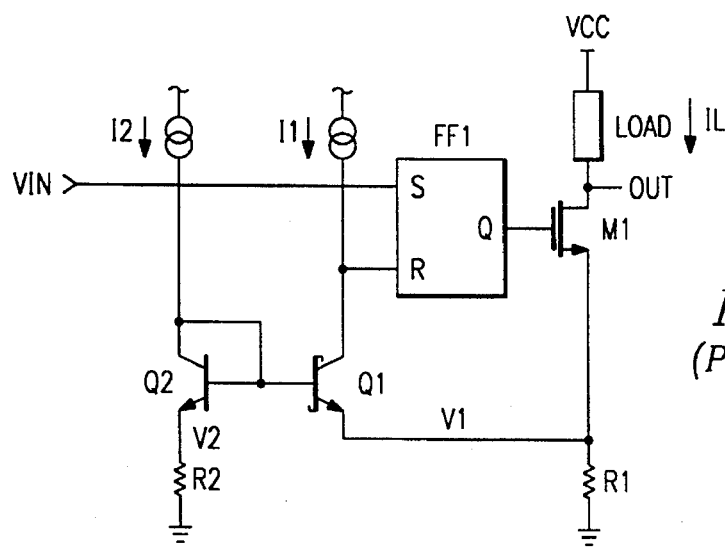
FIG. 3 (prior art) depicts a schematic of a prior art current limiting circuit using an emitter-side comparator.

The presence of the product of two emitter areas in the numerator of equation (6) is quite helpful, as this allows a wide range of threshold currents to be achieved without the need for grossly oversized transistors. By choosing the sizes of the transistors carefully, the user can achieve a large range of threshold current limits for any value of R1. For an example, if Q12 and Q13 each have emitter areas four times greater than Q11 and Q14, a room-temperature potential of 72 mV can be developed, which is more than sufficient for a typical aluminum resistor sensing scheme. The cross-coupled quad comparator circuit is thus better suited to this application than a prior art comparator circuit containing only a pair of transistors, such as that of FIG. 3, which would require a 16:1 transistor size ratio to achieve the same potential.

The advantageous operation exhibited by the circuit of FIG. 4 can be summed up as follows: the comparator circuit inherently compensates for the temperature coefficient of an aluminum current sensing resistor by using the inherent temperature coefficient of a proportional-to-absolute-temperature (PTAT) voltage, and these temperature coefficients effectively cancel leaving a reference current comparison result which is substantially independent of any temperature coefficient which happens to be possessed by current sources I1 and I2. This makes possible a simple and elegant current limiting circuit which has a considerable degree of temperature independence. Also, since the currents I1 and I2 are not part of the expression for the threshold voltage, less accuracy is required in the current sources, and the circuit is independent of process variations to a greater degree than circuits of the prior art.

The circuit of FIG. 4 is shown and described above as a current limiting circuit. However, the circuit can also be used to check the values of resistances fabricated on an integrated circuit. By supplying a certain known current into the output transistor M1, and by rearranging the expression of equation (6) for R1, it is straightforward to check the resistance R1, since the emitter areas are also known. If the circuit does not trip as expected to limit a specified current, R1 may be too small. Alternatively, if the circuit trips before it is expected to, R1 may be too large. So without modification, the circuit of FIG. 4 can be used as an on board measure of actual resistance values on fabricated integrated circuits. This measure can be used to quickly determine whether a particular lot of material is within an acceptable range and justifies the time and expense of further tests, or whether it is outside the acceptable range and should be scrapped without further testing, probing and packaging costs being expended. This technique is also used to trim the current limit by adjusting the value of the resistor R1 based on measurements, or by inserting or removing parallel transistors so as to alter the emitter areas of the cross coupled quad until the desired current threshold is achieved.

The cross coupled quad devices of FIG. 4, combined with resistor R1, and current sources I1 and I2, make up another useful circuit without modification; that is a temperature independent current sensing circuit which toggles an output when the current through the resistor R1 exceeds a threshold. This circuit can be used in any environment where a current sensing or limiting function is required, not merely those providing protection against overcurrent conditions, where bipolar transistors are available for the cross coupled quad. For example, this circuit can be used as the comparator for the inner, current-control loop of a current mode control scheme for a switch-mode power supply. Another interesting case in one in which the four NPN transistors of FIG. 4 are equal in area. In that case, equation (6) indicates that the circuit has a threshold directly proportional to the natural logarithm of one, and should trip at zero current. This configuration is applicable as the comparator for hysteretic current-mode switch-mode power supplies.

Figure 5:
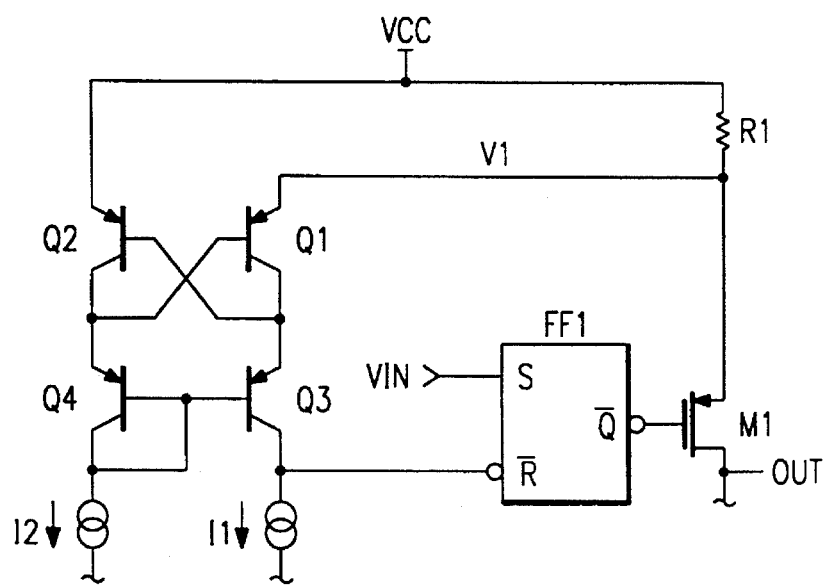
FIG. 5 depicts a schematic of a high side driver embodiment of a current limiting circuit incorporating the invention.

The circuit of FIG. 4 can be simply converted for use with a high-side-drive switch. FIG. 5 depicts such a circuit. In FIG. 5, FF1 is coupled to a PMOS high side output driver M1. When FF1 is set, the Q output of the flip flop enables the output transistor M1. Resistor R1 again monitors the current flowing through the output transistor and creates a voltage V1 which is proportional to this current. The cross coupled quad of PNP transistors 21–24 works in the same manner as the NPN transistors of FIG. 4, and when the voltage across R1 exceeds the trip point, the flip flop FF1 will be reset and the output transistor M1 will be shut down.

The circuit of FIG. 5 is a complementary circuit to that of FIG. 4, and works well in processes where complementary NPN and PNP transistors are available. Many processes are limited, however, in that the only suitable PNP transistors available are lateral PNP transistors, and these exhibit the onset of high-level injection at much lower current levels than NPN transistors. In high level injection, the slope of the voltage current relationship or Vbe/ln(Ie) curve changes, and, in theory, approaches a new value corresponding to the relationship:

$$Ie \propto \exp(qVbe/(2kT)) \quad (7)$$

Thus, the actual current limit obtained in such a case will be larger than that predicted by equation (6), and the limit may vary depending upon the degree of high-level injection occurring in the four PNP transistors of the cross coupled quad. This effect can be characterized, and with some modeling trial and error the circuit can be designed to operate nearly as well as the NPN version of FIG. 4. However, care must be taken in such a case as the effects of process shifts and temperature variation remain worrisome considerations for circuits incorporating lateral PNP transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current limiting circuit, comprising:
   an output transistor coupled between a circuit output terminal and a terminal for receiving a power supply, and having a gate input for enabling the output transistor;
   a resistance coupled between the output transistor and the terminal for receiving said power supply, and producing a voltage at a voltage reference node which is proportional to the current flowing in the output transistor;
   a memory having an output coupled to the gate of said output transistor and enabling the output transistor in response to a voltage at a circuit input terminal, and having a reset input; and
   a comparator comprising a cross coupled quad circuit coupled to said voltage reference node and having a compare output coupled to the reset input of said memory for resetting said memory in response to the voltage at said voltage reference node exceeding a predetermined threshold voltage.

2. The current limiting circuit of claim 1, wherein said comparator comprises:
   a first terminal for receiving a current;
   a second terminal for receiving a current;
   a first bipolar transistor having a collector and a base coupled together and to said first terminal, and having an emitter coupled to a first cross coupling node, said emitter having a first emitter area Ae1;
   a second bipolar transistor having a collector coupled to said second terminal and to said compare output, having a base coupled to the base of said first transistor, and having an emitter coupled to a second cross coupling node, said emitter having a second emitter area Ae2;
   a third bipolar transistor having a collector coupled to said first cross coupling node and having a base coupled to said second cross coupling node, and having its emitter coupled to a ground terminal, said emitter having a third emitter area Ae3; and
   a fourth bipolar transistor having a base coupled to said first cross coupling node and a collector coupled to said second cross coupling node, and having its emitter coupled to said voltage reference node, said emitter having a fourth emitter area Ae4;

the cross coupled quad circuit formed from said first, second, third and fourth bipolar transistors outputting a high voltage on said compare output when the voltage at said voltage reference node exceeds a threshold voltage $V=(kT/q)\ln((Ae2Ae3)/(Ae1Ae4))$, wherein k=Boltzmann's constant, T=absolute temperature, and q is the elementary electron charge constant.

3. The comparator of claim 2, wherein the threshold voltage V of said comparator is proportional to absolute temperature.

4. The comparator of claim 3, wherein said resistance is an aluminum resistor R and the threshold current obtained from the comparator and resistor R is a temperature independent current $I=(kT/qR)\ln((Ae2Ae3)/(Ae1Ae4))$, the temperature dependence of the aluminum resistor R effectively canceling the term T in the relationship for the current I.

5. The circuitry of claim 2, wherein each of the bipolar transistors is an NPN transistor.

6. The circuit of claim 5, wherein the current limiting circuit is a low side driver.

7. The circuitry of claim 2, wherein each of the bipolar transistors in a PNP transistor.

8. The circuitry of claim 7, wherein the current limiting circuit is a high side driver.

9. The comparator of claim 1, wherein the resistance is an aluminum resistor.

10. The comparator of claim 1, wherein the output transistor is an NMOS transistor.

11. The comparator of claim 1, wherein the output transistor is a PMOS transistor.

12. A zero current detection circuit, comprising:
    a resistor coupled between a load and a reference supply voltage, and outputting a voltage proportional to the current flowing in said load; and
    a cross coupled quad comparator coupled to said voltage and having an output that indicates when there is no current flowing in said load.

13. The zero current detection circuit of claim 12, wherein said cross coupled quad comparator comprises:
    a first terminal for receiving a first supply current;
    a second terminal for receiving a second supply current;
    a first bipolar transistor having a base and a collector coupled to said first terminal for receiving a first supply current, and having an emitter coupled to a first cross coupling node;
    a second bipolar transistor having a base coupled to the base of said first bipolar transistor, a collector coupled to said second terminal for receiving said second supply current and to an output terminal, and having an emitter coupled to a second cross coupling node;
    a third bipolar transistor having a collector coupled to said first cross coupling node, a base coupled to said second cross coupling node, and an emitter coupled to a reference voltage; and
    a fourth bipolar transistor having a base coupled to said first cross coupling node, a base coupled so said second cross coupling node, and an emitter coupled to said output voltage of said resistor;
    wherein said first, second, third and fourth bipolar transistors each are NPN transistors having equal emitter areas, such that the threshold current for said cross coupled quad comparator to output a high voltage on said output terminal is a current of zero.

14. A resistance measuring circuit, comprising:

an aluminum resistor coupled between a circuit terminal and a power supply, for outputting a voltage proportional to the current flowing in the resistor; and a cross coupled quad comparator coupled to said resistor and having an output for indicating when the voltage across said resistor exceeds a predetermined threshold.

15. The resistance measuring circuit of claim 14, wherein said cross coupled quad comparator comprises:

a first terminal for receiving a first supply current;

a second terminal for receiving a second supply current;

a first bipolar transistor having a base and a collector coupled to said first terminal for receiving a first supply current, and having an emitter with area Ae1 coupled to a first cross coupling node;

a second bipolar transistor having a base coupled to the base of said first bipolar transistor, a collector coupled to said second terminal for receiving said second supply current and to an output terminal, and having an emitter with area Ae2 coupled to a second cross coupling node;

a third bipolar transistor having a collector coupled to said first cross coupling node, a base coupled to said second cross coupling node, and an emitter with area Ae3 coupled to a reference voltage; and a fourth bipolar transistor having a base coupled to said first cross coupling node, a base coupled so said second cross coupling node, and an emitter with area Ae4 coupled to said output voltage of said resistor;

wherein said first, second, third and fourth bipolar transistors each are NPN transistors, such that the threshold output voltage V of said resistor required for said cross coupled quad comparator to output a high voltage on said output terminal is $V=(kT/q)\ln((Ae2Ae3)/(Ae1*Ae4))$, where k is Boltzmann's constant, T is absolute temperature, and q is the elementary charge constant.

16. The resistance measurement circuit of claim 15, wherein the threshold voltage of said cross coupled quad comparator is proportional to absolute temperature, such that the threshold current flowing in the aluminum resistor R which will cause the output voltage across the resistor to exceed the threshold voltage V of the comparator is a current $I=(kT/qR)\ln((Ae2Ae3)/(Ae1Ae4))$, and I is substantially independent of temperature.

17. A method for providing a current limiting circuit, comprising the steps of:

providing an output transistor coupling a circuit output terminal and a reference voltage terminal, responsive to a gate input;

providing a resistor coupled between said output transistor and said reference voltage for generating a voltage proportional to the current flowing in said output transistor;

providing a cross coupled quad comparator coupled to said resistor and having an output for indicating when the voltage on said resistor exceeds a predetermined threshold; and operating said output transistor to supply current in a load, the current flowing in said resistor generating a voltage proportional to the current flowing in said output transistor, and designing said quad comparator to output a signal indicating when said current exceeds a predetermined limit, and shutting down said output transistor when said limit is exceeded.

18. The method of claim 17 and further comprising the steps of:

providing a memory having a set input coupled to a circuit input terminal and having an output coupled to the gate of said output transistor and enabling said output transistor responsive to said circuit input terminal, the memory having a reset input coupled to the output signal from said comparator for resetting said memory and disabling said output transistor when said current limit is exceeded.

19. The method of claim 17, wherein said step of providing a cross coupled quad comparator comprises the steps of:

providing a first terminal for receiving a current;

providing a second terminal for receiving a current;

providing a first bipolar transistor having a collector and a base coupled together and to said first terminal, and having an emitter coupled to a first cross coupling node, said emitter having a first emitter area Ae1;

providing a second bipolar transistor having a collector coupled to said second terminal and to said compare output, having a base coupled to the base of said first transistor, and having an emitter coupled to a second cross coupling node, said emitter having a second emitter area Ae2;

providing a third bipolar transistor having a collector coupled to said first cross coupling node and having a base coupled to said second cross coupling node, and having its emitter coupled to a ground terminal, said emitter having a third emitter area Ae3; and providing a fourth bipolar transistor having a base coupled to said first cross coupling node and a collector coupled to said second cross coupling node, and having its emitter coupled to said voltage reference node, said emitter having a fourth emitter area Ae4; and operating the cross coupled quad circuit formed from said first, second, third and fourth bipolar transistors to output a high voltage on said compare output when the voltage at said voltage reference node exceeds a threshold voltage $V=(kT/q)\ln((Ae2Ae3)/(Ae1Ae4))$, wherein k=Boltzmann's constant, T=absolute temperature, and q is the elementary electron charge constant.

20. The method of claim 19, wherein said step of providing a resistor comprises the step of providing an aluminum resistor.

* * * * *